United States Patent [19]

Bolomey et al.

[11] Patent Number: 4,780,661
[45] Date of Patent: Oct. 25, 1988

[54] HIGH FREQUENCY IMPEDANCE MEASURING APPARATUS USING TWO BIDIRECTIONAL COUPLERS

[75] Inventors: Jean-Charles Bolomey, Paris; Daniel Solal, Neuilly S/Seine, both of France

[73] Assignee: Centre National de la Recherche Scientifique, Paris, France

[21] Appl. No.: 891,115

[22] Filed: Jul. 31, 1986

[30] Foreign Application Priority Data

Aug. 2, 1985 [FR] France ................... 85 11886

[51] Int. Cl.[4] .................. G01R 27/06; G01N 22/00; A61B 5/05
[52] U.S. Cl. .................. 324/58 B; 324/58 R; 324/57 R; 128/734; 128/804
[58] Field of Search ............ 324/58.5 B, 58.5 R, 324/58 B, 58 R, 57 R; 128/734, 804, 736

[56] References Cited

U.S. PATENT DOCUMENTS 2,931,900   4/1960   Goodman ................... 324/58 B
3,248,647   4/1966   Eichaker ................... 324/58 B
3,986,113  10/1976   Vifian ....................... 324/85
4,506,209   3/1985   Landt ....................... 324/57 R

FOREIGN PATENT DOCUMENTS 2497947   7/1981   France .
2560998   9/1985   France ................... 324/58 B
1160331   6/1985   U.S.S.R. ................. 324/58 B

OTHER PUBLICATIONS

I.E.E. Proceedings Section A a I, vol. 129, No. 6 Partie H, Dec. 1982, pp. 363-366, Old, Woking, Surrey, GB; M. A. Wood.

Primary Examiner—Reinhard J. Eisenzopf
Assistant Examiner—Jack B. Harvey
Attorney, Agent, or Firm—Stevens, Davis, Miller & Mosher

[57] ABSTRACT

High frequency impedance measurements using a reflectometer measuring the impedance of a body disposed between two electrodes, by means of two bidirectional couplers connected by controlled variable attenuators to a mixer circuit determining the modulus and the phase of the coefficient of the reflection due to the load, independently of the power level of the generator.

10 Claims, 3 Drawing Sheets

HIGH FREQUENCY IMPEDANCE MEASURING APPARATUS USING TWO BIDIRECTIONAL COUPLERS

BACKGROUND OF THE INVENTION

1. Field of the Invention

The present invention relates to a high frequency impedance measuring apparatus applicable to the impedance measurement of bodies of all kinds and particularly well adapted to the measurement of impedance in the hyperthermia field.

2. Description of the Prior Art

Impedance measurements have a fundamental interest in the field of hyperthermia where the problem consists in dissipating in the human body, or in localized regions thereof, an electromagnetic power delivered by a generator and applied to the region to be treated by means of application electrodes, this electromagnetic power being used for raising the temperature of the tissues.

The part thus treated forms, with respect to the application electrodes, an unknown impedance load which plays a very direct part in the transfer of power from the generator to the load; the frequency of the electromagnetic waves generally used in hyperethermia being between about 1 MHz and a few tens of MHz, remaining generally less than 50 MHz.

Up to now, the measurement of the real and imaginary parts of the impedance of the zone to be treated by hyperthermia uses means derived from low frequency impedance measurement means; these means being such for example as impedance bridge circuits used with a zero method or a substitution method. But the use of these means at relatively high frequencies means that precautions must be taken which are insufficient, such as: shielding the elements which are exposed to high frequency radiation, reducing as much as possible the parasite inductances and judicious interpretation of the results, taking into account all the disturbances which it is not possible to eliminate.

This leads to numerous and time-consuming manipulations which may prove injurious for the patient, the interpretation of the results being itself very difficult. Since hyperthermia treatment may require the consecutive treatment of several zones, which zones may have different impedances, the speed and accuracy with which these impedances are determined represent conditions of prime importance which are very imperfectly fulfilled at the present time.

At much higher frequencies such as microwaves frequencies where the wavelength is much smaller, the unknown impedance Z loading the end of a line may be determined after studying the intensity distribution of the electric field at different points of the line; the mismatching between the characteristic impedance Z of the line and the load impedance Z generating a standing waves system.

Measurement of the standing waves allows a coefficient of reflection $\rho = Re^{j\phi}$ to be derived, R being the modulus and $\phi$ the argument of this coefficient of reflection; since this latter is related to the impendence Z by the relationship $$\rho = (Z - Z_c)/(Z + Z_c),$$

the unknown load impedance Z can be determined.

To find the coefficient of reflecting $\rho$, a very well known method consists in moving a measuring probe along the line for measuring the field intensity at different points of this line and for finding the amplitude of the field maxima and minima. The amplitude ratio of the maxima to that of the minima is called standing wave ratio, whence is derived the modulus of the coefficient $\rho$; the argument of this latter being derived from a measurement of the distance between the end of the line and the first field maximum.

The preceding method has however the drawback of involving a succession of time consuming and delicate manipulations and, considering the relatively large wavelengths used in hyperthermia, its use in his field will require an apparatus requiring considerable space.

To overcome these drawbacks, apparatus may be used derived from those described in these U.S. Pat. Nos. 3,986,113 and 4,506,209, and in the article by WOOD "Measurement of scattering parameters at 35 GMz using amplitude modulated homodyne detection" published in IEEE PROC vol 129, Pt H, No. 6, December 1982, pages 363-366.

These apparatus have however the drawback that they must be used with a matched generator of fixed power, which excludes the use thereof in fields such as hyperthermia where the apparatus operates with variable power (from 1 up to about 1000 watts). Furthermore, the mixers which they comprise require practically constant power levels a requirement which can only be satisfied in the laboratory and not in a hospital environment where the apparatus must be handled by operators generally having no qualifications in electronics.

The present invention provides then a measuring apparatus of the above mentioned type, which which may be used with an unmmatched generator delivering variable powers, requiring the simplest adjustments possible and being adaptable automatically to a large number of cases of use, over a large frequency range, without requiring a highly qualified operator, for hyperthermia, biomedical or any other type of application, particularly industrial.

SUMMARY OF THE INVENTION

For this, the present invention provides a high frequency impedance measuring apparatus wherein:

a first bidirectional coupler is inserted, by means of line sections having a known characteristic impedance $Z_c$, between a generator generating a high frequency wave of variable power and electrodes between which is placed a body whose impedance Z, unknown, is to be measured, the first coupled channel of said first coupler measuring the incident wave on the impedance Z, is connected through a second bidirectional coupler and a single inverter, either to an impedance of one of the following types: zero impedance and practically infinite impedance, or to a first matched load, the second coupled channel of said first coupler, measuring the wave reflected by the impedance Z, is connected through a first inverter of a double inverter, either to a second matched load or, through a first variable attenuator, to the input of a first power divider without phase shift between its two outputs connected to the RF inputs of two mixers, the first coupled channel of said second coupler, measuring the incident wave towards said simple inverter, is connected through a second variable attenuator to the input of a second power divider with 90° phase shift between its two outputs connected to the LO inputs off said two mixers, the second coupled channel of said second coupler measuring the wave reflected from said simple inverter, being connected through the second inverter of said double inverter, either to the input of said first attenuator when said second coupled channel of said first coupler is connected to said second matched load, or to a third matched load when said second coupled channel of said first coupler is connected to the input of said first attenuator, the I.F. output of said two mixers delivering two signals representing the real part and the imaginary part, respectively of the value of the incident wave on the impedance Z when said single and double inverters are in their first positions, and the real and the imaginary part of the value of the wave reflected by the impedance Z, when said single and double inverters are in their second positions, from which may be determined the coefficient of reflection of the impedance Z, then the impedance Z by the relationship $$Z=Z_c(1+\rho)/(1-\rho)$$

According to an advantageous characteristic of the invention, a power measuring device is inserted at the input of said second divider, and this measuring device is connected to a control device controlling said first and second variable attenuators.

BRIEF DESCRIPTION OF THE DRAWINGS

The present invention will be better understood from reading the detailed description of one embodiment taken as non limitative example and illustrated by the accompanying drawings in which.

DESCRIPTION OF THE PREFERRED EMBODIMENT

Figure 1:
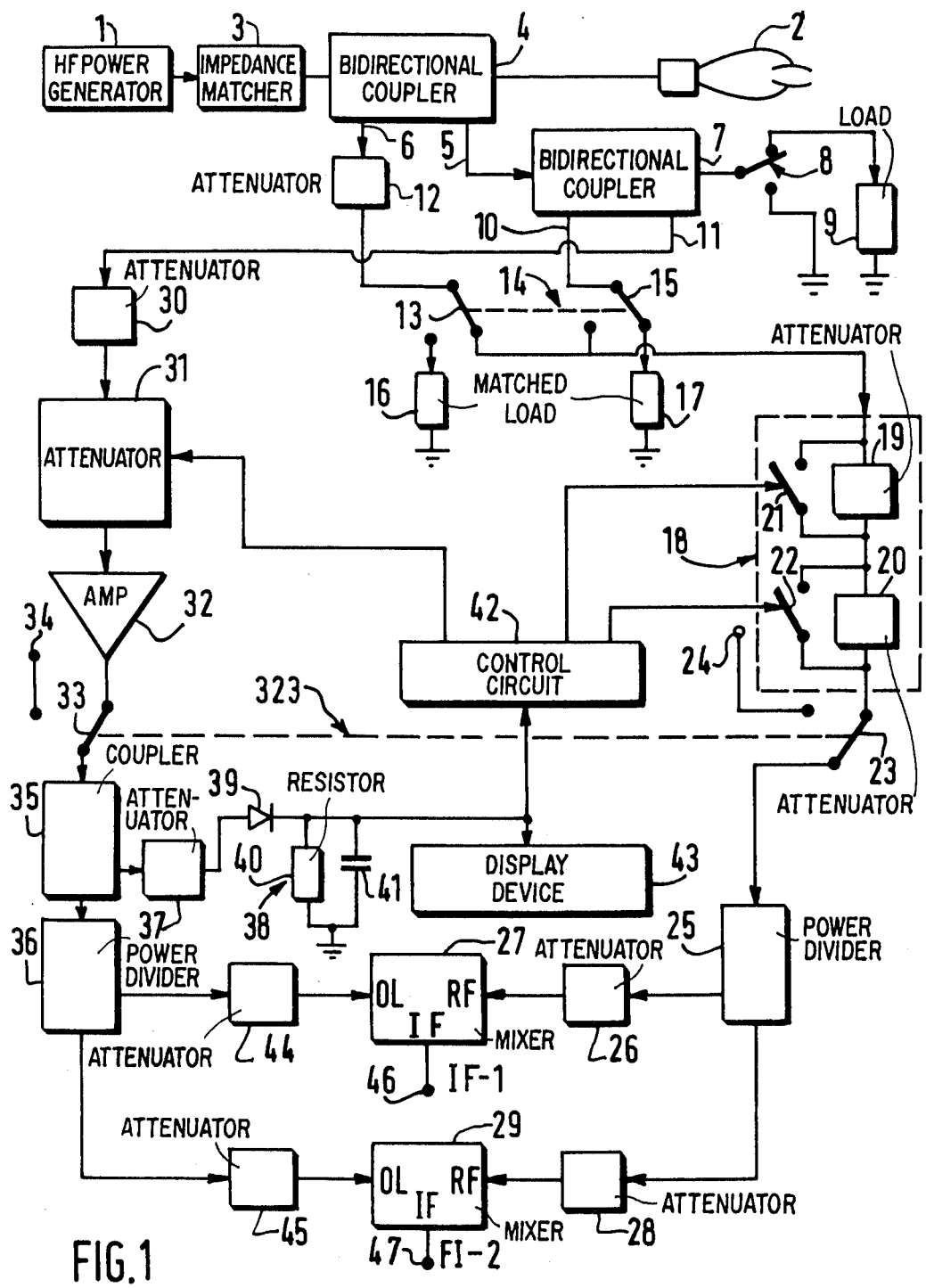
FIG. 1 is a block diagram of a first part of the apparatus of the invention.

The measurement apparatus described here is intended to be used for measuring electric magnitudes proper to living tissues such as parts of the human body and in particular their impedance, but it should of course be understood that it is not limited to such applications.

The measurement apparatus of the invention cooperates with a high frequency power generator 1, delivering a power varying for example from 1 Watt to 1,000 Watts (30 to 60 dBm) at a frequency between a few tens of kHz and several MHz, and in the present case between 2 and 32 MHz for example. The generator 1 is intended, in the application considered, to supply electrodes 2 with power which are disposed appropriately on living tissues, so as to treat these tissues by hyperthermia, while measuring with the apparatus of the invention the impedance Z equivalent to these tissues placed between electrodes 2. Between generator 1 and electrodes 2, is inserted in impedance matcher 3 of known type, and the main channel of a bidirectional coupler 4. All these elements as well as the other elements of the apparatus described below are connected together by lines, preferably coaxial lines, having a given characteristic impedance Zc. In the present case, this characteristic impedance Zc is is 50 ohms. This coupler 4 has an attenuation of about 30 dB or more between its main channel and each of its coupled channels. One of these coupled channels, referenced 5, measures the energy fed to the electrodes, that is to say, incident on the impedance Z, the other coupler channel referenced 6, measures the energy reflected by the electrodes, that is to say reflected by the impedance Z. The coupled channel 5 is connected via the main channel of a second bidirectional coupler 7 to the mobile contact of a single inverter 8. One of the fixed contacts of inverter 8 is connected directly to ground, whereas the other is connected through a matched load 9 to ground. By matched load is understood a load (generally a pure resistance associated, as the case may be, with reactive impedance correction elements) having, in the range of frequency used, an impedance equal to the characteristic impedance of the line to which it is connected and not causing any standing waves therein. In the present case, this characteristic impedance is, as stated above, 50 ohms; and all the couplers and attenuators described here must also be provided for this characteristic impedance. The coupler 7 has an attenuation of 3 dB between its main channel and its coupled channels 10 and 11, which have the same characteristics as the channels 6 and 5 respectively of coupler 4.

The channel 6 of coupler 4 is connected via a 9 dB attenuator 12 to the first mobile contact 13 of a double inverter 14 whose other mobile contact is referenced 15. The mobile contact 13 cooperates with the first fixed contact which is connected to ground through a matched load 16 and a second fixed contact which is connected to the first fixed contact with which the mobile contact 15 cooperates, the second fixed contact with which this mobile contact 15 cooperates being connected to ground through a matched load 17. The mobile contact 15 is connected to the coupled channel 10 which measures the energy of the wave reflected from the single inverter 8.

The fixed contacts of the inverter 14 which are connected together are also connected to the input of a circuit 18 with controlled variable attenuation. In the embodiment shown, the circuit 18 has 2 attenuators 19, 20 each of 10 dB connected together in cascade, each of them being able to be short-circuited independently of the other, by two switches 21 and 22 respectively. Of course, the circuit 18 may have a single attenuator with progressive variation of its attenuation between 0 and 20 dB for example.

The output of circuit 18 is connected to a fixed contact cooperating with the first mobile contact 23 of a double inverter 323. The other fixed contact cooperating with the first mobile contact 23 is connected to a terminal 24 which may be connected to a first output of an external source, which may for example be a laboratory generator, delivering in the present case, a signal of about −6 dBm to this terminal 24.

The first mobile contact 23 of the double inverter 323 is connected to the input of a power divider 25 without phase shifting between its outputs, formed for example, in a way known per se, by a 3 dB 0° coupler. An output of divider 25 is connected via a 3 dB attenuator 26 to the RF signal input of a mixer 27, whereas the other output of the divider 25, is connected via 3 dB attenuator 28 to the RF input of a mixer 29.

Channel 11 of coupler 7, which measures the incident energy towards the signal inverter 8, is connected via a 16 dB attenuator 30 to a controlled variable attenuator 31, whose attenuation may vary between 3 and 30 dB for example. The output of attenuator 31 is connected by an amplifier 32 with a gain equal to 40 dB to a fixed contact cooperating with the second mobile contact 33 of the double inverter 323. The other fixed contact cooperating with the second mobile contact 33 is connected to a terminal 34, which may be connected to a second output of the same external source as the one mentioned above, but this second output would have to deliver, in the present case, a +14 dBm signal, for operating the mixers optimally. Of course, the double inverter 323 is adapted so that the mobile contacts 23 and 33 are connected simultaneously to the terminals 23 and 34 or else to the outputs of elements 18 and 32.

The mobile contact 33 is connected via a coupler 35 to a power divider 36 cooperating with the mixers 27 and 29.

This power divider 36 has a phase shift of 90 degrees between its outputs, ad it is formed in a way known per se for example, by a 3 dB 90° coupler, one of its outputs being connected via a 3 dB attenuator 44 to the local oscillator input LO of the mixer 27, the other output being connected via 3 dB attenuator 45 to the local oscillator input LO of the mixer 29. The intermediate frequency outputs I.F. of mixers 27 and 29 are connected respectively to terminals 46 and 47 from which signals I.F.−1 and I.F.−2 are collected The coupler 35 is a coupler whose coupled channel is attenuated by 10 dB with respect to the main channel, this coupled channel being connected via a 9 dB attenuator 37 and a detection circuit 38 including a diode 39, a resistor 40 and a capacitor 41, to the input of a control circuit 42, and to the input of a display device 43. This device 43 may for example provide display by means of light emitting diodes forming what is generally called "bar-graph", the purpose of device 43, being mainly to determine whether the level of the energy reaching element 36 is situated within a certain range of values allowing mixers 27 and 29 to operate optimally or not.

The control circuit 42 controls the variable attenuator 18 (in the present case: switches 21 and 22) and the variable attenuator 31, so as to maintain the levels of the signals fed to mixers 27 and 28 within a range of optimum values.

Of course, all the attenuation values of the attenuators mentioned above are related to the characteristics of the type of mixers 27 and 29 used. In the present case, these mixers operate optimally if they receive at their L.O. input a signal of about 7 dBm (i.e. 5 mW) and at their RF input a signal less by at least 20 dB than that fed to LO, namely a signal of about −13 dBm.

Figure 2:
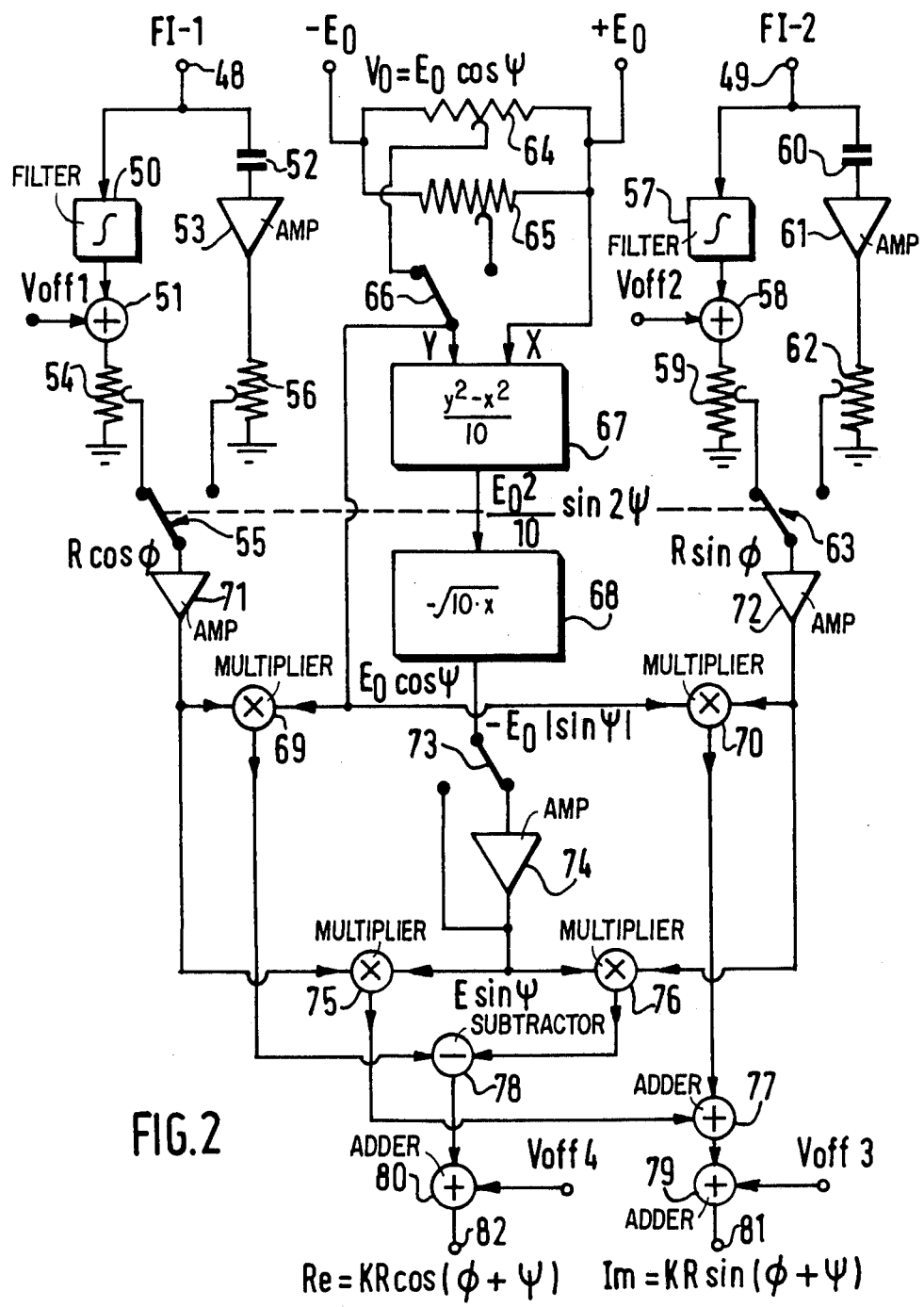
FIG. 2, is a block diagram of the second part of the apparatus, located downstream of the first part shown in FIG. 1.

In FIG. 2 is shown a circuit whose two signal input terminals 48, 49, are connected respectively to the terminals 46, 47 of the circuit of FIG. 1.

Terminal 48 is connected on the one hand by a low pass filter 50 to an input of an adder 51 receiving at its other input an adjustable offset DC voltage V off 1, and on the other hand, by a galvanic isolating capacitor 52 to the input of a low noise amplifier 53. The output of adder 51 is connected to ground through a potentiometer 54 whose slider is connected to a fixed contact of an inverter 55 whose other fixed contact is connected to the slider of a potentiometer 56 connecting the output of amplifier 53 to ground.

Terminal 49 is connected to a circuit similar to that to which terminal 48 is connected, namely a low pass filter 57 connected to an adder 58, receiving an adjustable offset DC voltage V off 2, and to a potentiometer 59, and a capacitor 60 followed by an amplifier 61 and a potentiometer 62. The sliders of the two potentiometers 59, 62, are connected to the fixed contacts of an inverter 63. The mobile contacts of the inverters 55 and 63 are ganged so as to be in contact either with the slider of potentiometers 54 and 59 respectively, or with those of potentiometers 56 and 62 respectively.

The circuit of FIG. 2 also includes potentiometers 64 and 65 connected in parallel to terminals brought to respective DC potentials −Eo and +Eo. Their sliders are connected to the fixed contacts of an inverter 66 whose mobile contact is connected to the input Y of a circuit 67, providing the function $(X^2-X^2)/10$, whose input X is connected to +Eo. The circuit 67 is an analog module of known type which performs operations such as multiplication, subtraction or addition on the analog signals X and Y applied to its inputs and delivers an output signal which is also analog.

Circuit 67 is followed by a circuit 68 of comparable type, but performing the function $-\sqrt{10.X}$. The mobile contact of inverter 66 is also connected to the inputs of 2 multipliers 69 and 70 whose other inputs are connected to the outputs of two amplifiers 71 and 72 respectively, whose inputs are connected to the mobile contact of inverters 55 and 63 respectively. The output of circuit 68 is connected by an inverter 73 either, or through an amplifier 74 with gain −1 to the inputs of two other multipliers 75 and 76 whose other inputs are connected to the outputs of the two amplifiers 71 and 72 respectively. The output of multipliers 70 and 75 are connected to an adder 77, and the outputs of multipliers 69 and 76 are connected to a subtractor 78. The outputs of adder 77 and of subtractor 78 are connected via adders 79 and 80 to terminals 81, 82, respectively, these adders receiving adjustable offset DC voltages V off 3 and V off 4 respectively.

Terminals 81 and 82, may be connected either to an oscilloscope on the screen of which is superimposed a Smith's chart, well known to a man skilled in the art, or to any appropriate processing device, able to calculate and display directly the electric magnitudes measured such as the impedance of the load disposed between the electrodes 2.

Before describing the operation in detail, and in particular the method of calibrating the apparatus which has just been described, the principle of operation will be described briefly, the different inverters being in the position shown in the figures.

A difference between the characteristic impedance Zc and the impedance Z placed between the electrodes 2 causes at the level of this latter, a reflection of the incident wave. This wave being propagated in the direction from generator 1 to electrodes 2. This reflection defines a reflected wave which is propagated in an opposite direction so from electrodes 2 to generator 1.

The degree of matching between the known characteristic impedance Zc and impedance Z, may be defined by the coefficient of reflection generated by the impedance Z. Therefore, this coefficient of reflection is determined first of all, whereby it is possible to derive the real and the imaginary components of the load impedance Z by the relationship $\rho=(Z-Zc)/(Z+Zc)$ that is to say $Z=Zc(1+\rho)/(1-\rho)$.

The coefficient of reflection $\rho = Re^{j\phi}$ where R and $\phi$ define respectively the modulus and the phase of the coefficient, is also expressed by the relationship $\rho = R \cos \phi + j \sin \phi$, which shows that the coefficient of reflection comprises two phase quadrature components.

Thus, in the part of the apparatus shown in FIG. 1, a signal relative to the incident wave and a signal relative to the reflected wave are mixed in an appropriate way so as to obtain a resultant signal comprising two parts in phase quadrature; one of these parts representing the real parts ($R \cos \phi$) and the other part representing the imaginary part ($R \sin \phi$) of the coefficient of reflection.

The directional coupler 4 thus delivers to the coupled channel 5 a first signal proportional to the incident wave which gives rise to a second signal proportional to the incident wave on the coupled channel 11. This signal, after passing through attenuators 30 and 31, amplifier 32 and the power measuring device 35–38, is divided in divider 36 so as to generate two reference signals phase shifted by 90° which are applied to the LO inputs of mixers 27 and 29 respectively.

The directional coupler 4 delivers to the coupled channel 6 a signal proportional to the reflected wave, which after passing through attenuators 12 and 18, is divided in divider 25 so as to generate two non-phase shifted signals applied to the R.F. input of mixers 27 and 29 respectively.

The analog multiplication made in mixers 27 and 29 gives rise, at the intermediate frequency outputs I.F. of these mixers, to signals whose DC components depend on the amplitudes and on the relative phase shift of the signals applied to their RF and LO inputs respectively.

Thus, assuming that during the calibrating procedure which will be described further on, it has been possible to compensate for the different parasite phase shifts, the DC component of this signal IF-1, the only one which is transmitted to the circuit of FIG. 2 downstream of the low pass filter 50, represents the real part $$R \cos \phi$$

of the coefficient of reflection whereas the DC component of the signal IF-2 represents the imaginary part $$R \sin \phi$$

of the coefficient of reflection $\rho$.

Thus, the signal applied to the input of amplifier 71 represents $R \cos \phi$ and the signal applied to the input of amplifier 71 represents $R \sin \phi$. The signal at the slider of the potentiometer 64 is a voltage Vo which may be written $$Vo = Eo \cos \psi$$

in which expression the angle $\psi$ may take on any value between 0 and $2\pi$ depending on the position of the slider of potentiometer 64.

It is clear that the output signal from circuit 67 is equal to:

$$(Eo^2 - Eo^2 \cos^2 \psi)/10$$

namely, $$(Eo^2 \sin^2 \psi)/10$$

and that the output signal from circuit 68 is equal to:
ti $-Eo|\sin \psi|$

At this level, the inverter 68 may direct this signal if required to the inverter circuits 74 so as to obtain Eo sin $\psi$. In fact:

If $\psi$ is between 0 and $\pi$, $\sin \psi \geq 0$: the inverter circuit 74 is used for obtaining $$+Eo|\sin \psi| = Eo \sin \psi$$

if $\psi$ is between $\pi$ and $2\pi$, $\sin \psi \leq 0$ and we keep $$-Eo|\sin \psi| = Eo \sin \psi$$

There is then available, as shown in FIG. 2, at the input Y of circuit 67 the DC signal $$Eo \cos \psi$$

and at the output of the inverter 74 the DC signal $$Eo \sin \psi$$

These signals are multiplied two by two with the signals proportional to $R \cos \phi$ and $R \sin \phi$ at the output of amplifiers 71 and 72 respectively, and a simple calculation shows that the output signals from the adder 77 and from the substractor 78 are equal to $$Im = Kr \sin (\phi + \psi)$$

$$Re = KR \cos (\phi + \psi)$$

respectively, where K is a coefficient of proportionality.

Thus, everything happens as if an angle of phase $\psi$, dependent on the position of the slider of the potentiometer 64 and of the position of the inverter 73 had been added to the angle of phase $\phi$, of the coefficient of reflection $\rho$. The circuit of FIG. 2, which is in fact an analog processing circuit, will therefore be designated in what follows by the expression "analog phase shifter". This circuit is obviously very useful in the calibration procedure which will now be described.

The procedure for calibrating the above described measurement apparatus will be described with generator 1 at its minimum power for example. This generator 1 is advantageously a generator having an internal impedance equal to the characteristic impedance of the lines used capable of accepting considerable mismatching such as a short circuit or an open circuit, which is generally the case with low power generators. The above described measurement apparatus is connected to an oscilloscope, the output 82 being connected to the X input and output 81 to the Y input of the oscilloscope, and the different inverters being always in the position shown in the drawings.

First of all, electrodes 2 are replaced by a matched load and the voltages V off 1 and V off 2 are adjusted so as to obtain $$Im = Re = 0$$

Then the output channels of the two mixers 27, 29 are adjusted using potentiometers 54 and 59, by short circuiting the electrodes 2. We will then call Rea and Ima the values of Re and Im, and potentiometer 54 is adjusted so as to have Rea and Ima at a sufficient level, without saturation, and this at any frequency in the band of frequencies used. Then a $\lambda/8$ line (at the frequency considered), is inserted between the coupler 4 and the short circuited electrodes 2. We will then call Reb and Imb the values of Re and Im, and the potentiometer 59 is adjusted so as to obtain Rea=Imb and it is then checked that, Ima=−Reb The short circuit of the electrodes must be displayed, when the λ/8 line has been removed, on the screen of the oscilloscope by a point superimposed with the short circuit indicated by Smith chart. Generally, on bringing the apparatus into service, or at the time of a change of electrodes and/or of the power supply lines of these electrodes, such super-position is not obtained, and the purpose of the step described just below of the calibration procedure is to obtain it, so as then to be able to read directly on the chart the value of the coefficient of reflection of the body disposed between the electrodes.

A part of the energy reflected by the short circuited electrodes 2 is taken off by the channel 6 of coupler 4 and is fed, via the contact 13 connected to the input of circuit 18, to the RF inputs of the mixers 27, 29. The IF-1 and IF-2 signals from these mixers are fed to the phase shifter of the FIG. 2, and by means of the potentiometer 64 and inverter 73, the phase shift of these signals is adjusted.

Then, the inverters 14 and 8 are switched, while connecting preferably a matched load in place of the electrodes. The incident energy measured by channel 5 is reflected by the short circuits of inverter 8, and this reflected energy is measured by channel 10 of coupler 7 for delivery to the RF inputs of mixers 27, 29. The incident energy measured by channels 5 and 11 is fed, as before to, the LO inputs of mixers 27, 29. Since the short circuit simulated at 8 generally produces at the level of outputs 46 and 47 a phase shift different from the one produced by the short circuit of the electrodes 2, so a point not coinciding on the screen of the oscilloscope with the short circuit indicated by the chart, this coincidence is obtained by means of potentiometer 65 after causing the inverter 66 to switch. Calibration is then finished, and measurements may be made by switching back the inverters 8, 14 and 66. Of course, instead of producing a short circuit of electrodes 2, they may be left open circuited, and the previously connected to ground fixed contact of inverter 8 left isolated i.e. practically infinite impedance. Then, calibration is carried out as described above by causing in both cases the point displayed on the screen of the oscilloscope to coincide with the open circuit (infinite impedance) of the chart.

The overall measurements of the impedance presented by the body disposed between electrodes 2 may then be made in two ways:

1. A generator is used having an internal impedance different from the characteristic impedance of the lines used, and not being able to accept considerable mismatching. This is the case of a generator for hyperthermia treatment which can deliver a high power. Then the complex value B is measured of the wave reflected by the body disposed between the electrodes within a coefficient of proportionality, inverters 8, 14, and 66 being in the position shown in the drawings. Then, by switching the inverters 8, 14 and 66, the complex value −A is measured of the incident wave (the sign −) being due to the total reflection produced by the short circuit of 8 which causes the signal thus reflected measured to be in phase opposition with the incident signal coming from channel 5. Using a computer circuit, such as a micro computer, the following is calculated:

$\rho = B/A$ where $Z = Zc \cdot (1+\rho)/(1-\rho)$ all these values being complex values the computing circuit being connected at 81 and 82.

2. A generator is used having internal impedance equal to the characteristic impedance of the line and able to accept mismatching, such as is the case with a low or medium power laboratory generator, and then matcher 3 is omitted. Then, the measurements may be made in the same way as in the case 1 above, but since there are no multiple reflections in the line, the power of the incident wave is constant and the variations of signals Re and Im represent, within a coefficient of proportionality, the variations of the coefficient of reflection. Instead of using a computing circuit, an oscilloscope may be used and for that 82 is connected to its X input and 81 to its Y input.

This overall impedance measurement may be made at any power level of generator 1, the control device 42 adjusting the attenuators 18 and 31 so that mixers 27, 29 work in their optimum operating zone. Knowing the impedance presented by the body, or load, the generator may be best adapted to this load by any appropriate means. Furthermore, in the application to hyperthermia, the process of thermal regulation may be observed by observing the variations of the electric characteristics of the parts of the body disposed between the electrodes having previously brought the point observed on the oscilloscope back to the centre of the Smith Chart, by adjusting the voltages V off 3 and V off 4 and the controls of the oscilloscope.

Another advantageous application of the measurement apparatus of the invention consists in the measurement of the dielectric properties of tissues, namely their dielectric permittivity and their conductivity, which are measured by replacing electrodes 2 by a coaxial probe the open end of which is placed in contact with these tissues. The variation of impedance thus caused is a function of the dielectric characteristics of these tissues in the vicinity of the open end of the probe. The evolution of these dielectric properties may of course be followed as a function of the temperature and of time during a hyperthermia treatment.

Figure 3:
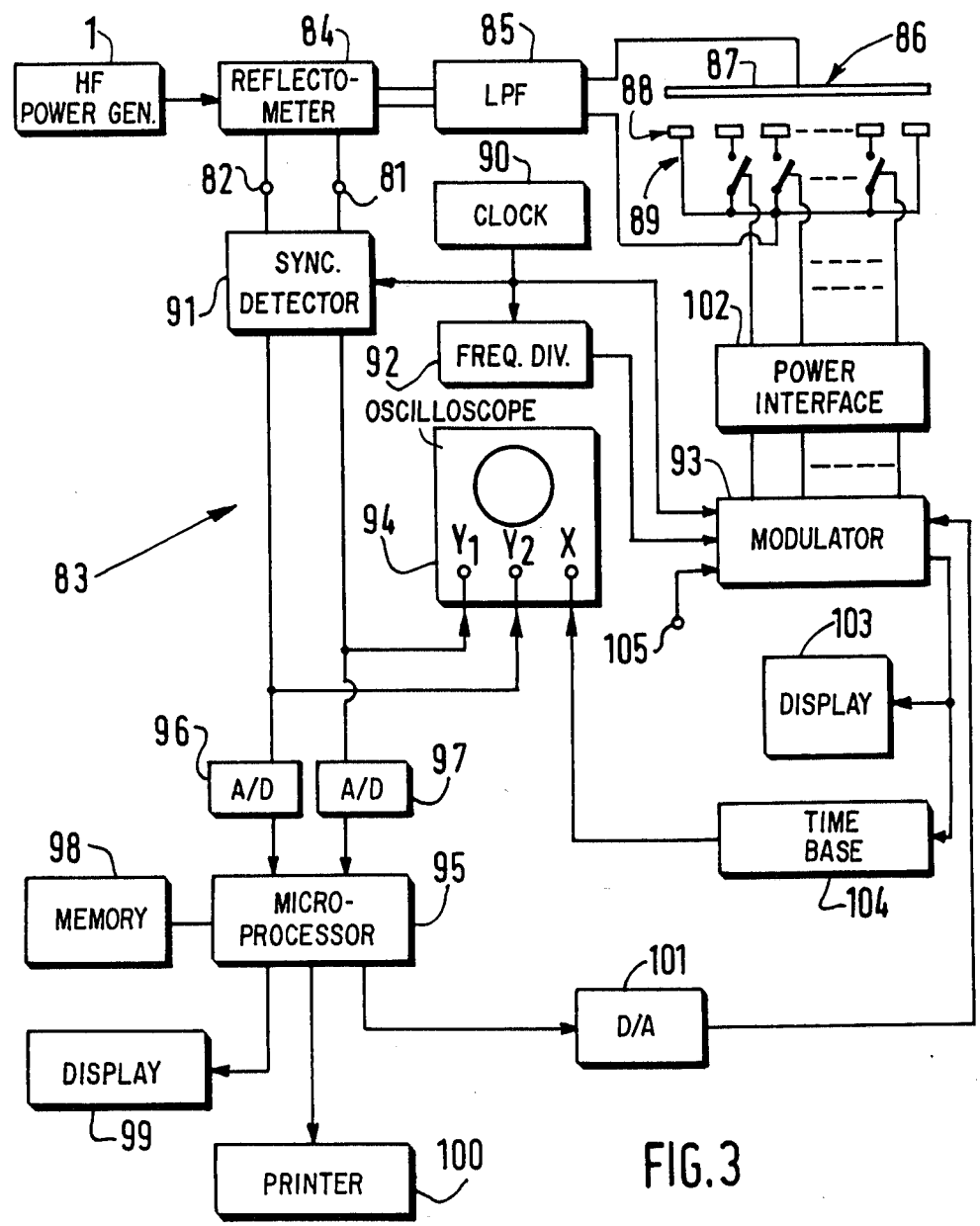
FIG. 3 is a diagram of using the apparatus of FIGS. 1 and 2 for differential image formation.

In FIG. 3 has been shown the block diagram of a measurement apparatus 83 in accordance with the invention, for carrying out localized measurements by sequential electronic scanning of modulated probes.

This measurement apparatus 83 is fed by a power generator, which may be the above mentioned generator 1, and it has a reflectometer 84 formed of elements 3 to 80 shown in FIGS. 1 and 2, inverters 55 and 63 being in the reverse position to that shown in the drawings, that is to say that they are in contact with the sliders of potentiometers 56 and 62 which in this case serve for balancing the gains.

Instead of connecting the conventional electrodes to coupler 4, a set of special electrodes 86 is connected thereto through a low pass filter 85, formed of a first electrode 87 having the conventional shape of a plate, and a second fragmented electrode 88, divided up into a large number, for example 48, of individual elementary electrodes electrically isolated from each other, the overall dimensions of electrode 88 being the same as those of electrode 87. The line connecting the filter 85 to the electrodes 86 is of the symmetric type one of its conductors being connected to electrode 87, and the other to the end elemetary electrodes of assembly 88, these end electrodes being for example eight in number on each side. The other elementary electrodes of assembly 88 are each connected via a controlled switch forming part of a switch assembly 89, comprising preferably PIN diodes, to said other conductor which is connected to the end elementary electrodes, these latter not being used for the measurement because of the risk of measuring phenomena disturbed by "edge effect" of the set of electrodes 86.

Apparatus 83 further includes a low frequency clock 90, producing rectangular signals at a frequency of 24 kHz, for example, and connected to a synchronous detector 91, to a frequency divider 92 and to the modulation control input of a modulator 93. The outputs 81, 82 of the reflectometers are connected to the synchronous detector 91, controlled by clock 90, the outputs of the detector being connected to the Y1 and the Y2 inputs of the oscilloscope 94, and to a microprocessor 95 via, in each case, an analog-digital converter 96, 97 respectively. Microprocessor 95 is connected conventionally to a mass memory 98, to a display device 99, to a printer 100 and to a digital-analog converter 10 whose output is connected to the control input of the clock of the modulator 93 controlling switches 89 via a power interface 102. Modulator 93 is further connected on the one hand to a display device 103, having here two seven segment display units, displaying the order number of the elementary electrode of assembly 89 which is modulated, and on the other hand, to a "time base" 104 whose output is connected to the X input of oscilloscope 94. Circuit 104 is a circuit producing, under the control of modulator 93, as many different DC voltages as there are controlled elementary electrodes in the assembly 89 (32 in the above mentioned case), these voltages being such that the lowest produces, in the absence of signals at Y1 and Y2 a point close to the left hand end of the OX axis, the highest producing a point close to the right hand end of the OX axis, the other voltages producing points spaced evenly along OX in correspondence with the respective elementary electrodes. The scanner control input of modulator 93 is connected via an inverter (not shown), to the output of converter 101, to that of divider 92 and to a terminal 105 to which may be fed external scanning signals, for example by manual scanning.

The power interface 102, has, for each switch of the assembly 89 that it controls, a conventional amplifying circuit amplifying the modulation signals (that is to say successive opening and closing operations of the same switch of the assembly 89) produced by clock 90 and transmitted by modulator 93. This modulator 93 is a demultiplexor sending, at the timing of scanning of the output signals of divider 92 (for example 400 Hz), the modulation signals to the successive switches of assembly 89. Such scanning of these switches may also be carried out manually (terminal 105) or under the control of microprocessor 95 via the converter 101.

The synchronous detector 91 in fact comprises a detector for each of the signals arriving at terminals 81, 82. These detectors provide mainly three functions: selective amplification of the signal about the intermediate frequency from the corresponding mixer, the product between the signal to be detected and the rectangular signal from Clock 90 which also provides modulation of the elementary electrodes of assembly 89, and filtering, in the spectrum of the signal produced, of the DC component proportional to the useful signal.

Generally, in capacitive hyperthermia, an overall measurement of the interelectrode impedance is made by reflectometry during the different phases of treatment of a patient, for example before and after the session. At the beginning, it is ascertained that the generator is correctly matched to its load, and at the end, the modifications of impedance caused either by the movements of the patient, or by the local temperature rise, are evaluated. By fractionating an electrode, the measurement space is fractionated, which allows the variations of electric magnitude to be evaluated more finely as a function of the morphology of the part of the body subjected to treatment, and so contours of tumors to be determined and development thereof to be evaluated.

The local measurement by the apparatus 83 described above, is carried out in accordance with the process of modulated disturbance. The tissue situated between the electrodes 86 has passing therethrough, in line with each elementary electrode energized, a current tube, whose section is imposed by the dimensions of this elementary electrode. The control of the corresponding switch by the signals from clock 90 disturb this current at the timing of these signals. Depending on the value of the load impedance present between electrode 87 and the elementary electrode energized, a part of the energy fed by generator 1 is reflected to this latter. With the reflectometer 84, the variations of the coefficient of reflection thus generated, can be measured. In the present case (monostatic configuration, that is to say when the return wave follows at least a part of the path of the outgoing wave), the information contained in the reflected wave is proportional to the square of the intensity of the current tube disturbed by the modulation of the corresponding switch. Taking into account the coupling impedance between the measurement probes, it can be shown that the square of the value of the disturbed current is proportional to the quadratic component of the admittance through which the current tube passes, this admittance being measured by means of apparatus 83, the voltages collected at the output of the synchronous detector 91 being proportional to the quadratic components of the local admittance of the body undergoing measurement. Thus, after calibrating the apparatus in the way explained above, the real and imaginary parts of the admittance of the body measured, except for a factor of proportionality, can be displayed on the screen of the oscilloscope 94 for the whole of electrodes 88, while neglecting the coupling impedances between the different elementary electrodes and its local variations in time may be followed.

This apparatus allows not only the efficiency of hyperthermic heating to be determined, but also the electrodes the best suited to the use contemplated to be selected, their position to be modified so as to better surround the zone to be treated and the power of generator 1 to be optimized.

Provided that arrangements are made within the scope of the man skilled in the art, the microprocessor 95 may be used for knowing the parameters required for correct matching of the generator to the load, despite the movements, the sudation of the patient and the modifications of the electric characteristics of the load as a function of the temperature rise, these parameters being the real and imaginary parts, the modulus and the phase of the admittance of the body disposed between the electrodes.

If a small dipole whose poles are connected together by a diode, or a small loop closed by a diode, is introduced into the tissues to be measured, in the path of the current tubes of the elementary electrodes, the measurement apparatus 83 may be used for making relative local measurements of the electromagnetic field respectively.

Naturally, and as it has already been mentioned, the applications of the apparatus of the invention are not limited to measuring the impedances of living tissues and may relate to any other applications, particularly industrial.

What is claimed is:

1. In a high frequency impedance measurement apparatus:
   a first bidirectional coupler is inserted, by means of line sections having a known characteristic impedance Zc, between a generator generating a high frequency wave of variable power and electrodes between which is placed a body whose impedance Z, unknown, is to be measured,
   the first coupled channel of said first coupler measuring the incident wave on the impedance Z, is connected through a second bidirectional coupler and a single inverter, to an impedance of one of the following types: a zero impedance, a practically infinite impedance, and a first matched load,
   the second coupled channel of said first coupler measuring the wave reflected by the impedance Z, is connected through a first inverter of a double inverter, either to a second matched load or, through a first variable attenuator, to the input of a first power divider without phase shift between its two outputs connected to the RF inputs of two mixers,
   the first coupled channel of said second coupler measuring the incident wave towards said single inverter, is connected through a second variable attenuator to the input of a second power divider with a phase shift of 90 degrees between its two outputs connected to the LO input of said two mixers,
   the second coupled channel of said second coupler measuring the wave reflected from said single inverter being connected through the second inverter of said double inverter, either to the input of said first attenuator when said second coupled channel of said first coupler is connected to said second matched load, or to a third matched load when said second coupled channel of said first coupler is connected to the input of said first attenuator,
   the IF output of said two mixers delivering two signals representing the real part and the imaginary part, respectively, of the value of the incident wave on the impedance Z when said single and double inverters are in their first positions, and the real part and the imaginary part of the value of the wave reflected by the impedance Z when said single and double inverters are in their second position, from which may be determined the coefficient of reflection of impedance Z, then impedance Z by the relationship $Z = Zc(1+\rho)/(1-\rho)$.

2. Measurement apparatus as claimed in claim 1, wherein a power measuring device is inserted at the input of said second divider, and this measuring device is connected to a control device controlling said first and second variable attenuators.

3. The measurement apparatus as claimed in claim 2, wherein said mixers are of a type having optimum operation when their local oscillator signal has a level of about +7 dBm and is greater by about at least 20 dB than an applied RF signal, said generator delivers power between substantially 30 and substantially 60 dBm, the first bidirectional coupler has a coupling coefficient of 30 dB, the second bidirectional coupler has a coupling coefficient of 3 dB, an attenuator of substantially 9 dB is inserted in the second coupled channel of said first coupler, in the first bidirectional coupled channel of said second coupler is inserted an attenuator of substantially 16 dB upstream of said second variable attenuator and an amplifier of substantially 40 dB downstream of the second variable attenuator, the first variable attenuator has an attenuation which may vary from 0 to about 20 dB and the second variable attenuator has an attenuation which may vary from 3 to about 30 dB, an attenuator of substantially 3 dB being inserted between each output of said power dividers and a corresponding input of the corresponding mixer.

4. The measurement apparatus as claimed in one of claims 1 to 3, wherein an analog phase shifting circuit is disposed at said IF outputs of said mixers.

5. The measurement apparatus as claimed in claim 4, wherein the analog phase shifting circuit has two different phase shift adjustments switched by means of a second single inverter actuated at the same time as said first single inverter and as said double inverter.

6. The measurement apparatus as claimed in one of claims 1 to 3, wherein one of the electrodes is fragmented into a large number of elementary electrodes electrically isolated from each other, each of these elementary electrodes being connected to its power supply conductor by a switch controlled by a modulator receiving modulation signals from a clock, this clock being connected to a synchronous detector disposed at the output of the measurement apparatus.

7. The measurement apparatus as claimed in claim 6, wherein the clock is connected by a frequency divider to a scanning control input of the elementary electrodes of the modulator.

8. The apparatus as claimed in claim 6, wherein a low pass filter and a symmetric line are inserted upstream of said electrodes.

9. The apparatus as claimed in claim 6, wherein the outputs of the synchronous detector are connected to two vertical deflection inputs of an oscilloscope, whose horizontal deflection input is connected to an output of the modulator via a time base circuit discretizing and displaying on the screen of the oscilloscope the signals relative to each of the elementary electrodes energized.

10. The apparatus as claimed in claim 6, wherein the outputs of the synchronous detector are each connected by an analog-digital converter to a microprocessor, itself connected by a digital-analog convertor to a scanning control input of the modulator.

* * * * *